(12) United States Patent
Lee et al.

(10) Patent No.: US 11,829,033 B2
(45) Date of Patent: Nov. 28, 2023

(54) DISPLAY APPARATUS INCLUDING BONDING MEMBER FOR ENHANCED HEAT DISSIPATION

(71) Applicant: SAMSUNG ELECTRONICS CO., LTD., Suwon-si (KR)

(72) Inventors: Youngmin Lee, Suwon-si (KR); Hyungsuk Kim, Suwon-si (KR); Kyungsoo Park, Suwon-si (KR); Hyukjun Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/825,685

(22) Filed: May 26, 2022

(65) Prior Publication Data
US 2023/0047093 A1    Feb. 16, 2023

Related U.S. Application Data

(63) Continuation of application No. PCT/KR2022/006761, filed on May 11, 2022.

(30) Foreign Application Priority Data

Aug. 13, 2021    (KR) .......................... 10-2021-0107129

(51) Int. Cl.
G02F 1/13357    (2006.01)

(52) U.S. Cl.
CPC .. *G02F 1/133608* (2013.01); *G02F 1/133603* (2013.01); *G02F 1/133605* (2013.01)

(58) Field of Classification Search
CPC ......... G02F 1/133608; G02F 1/133603; G02F 1/133605
See application file for complete search history.

(56) References Cited

U.S. PATENT DOCUMENTS

| 9,310,645 B2 | 4/2016 | Lee et al. |
| 9,989,803 B2 | 6/2018 | Ishizuka |

(Continued)

FOREIGN PATENT DOCUMENTS

| JP | 2010-210891 A | 9/2010 |
| JP | 2018-88008 A | 6/2018 |

(Continued)

OTHER PUBLICATIONS

International Search Report (PCT/ISA/210) dated Aug. 31, 2022 issued by the International Searching Authority in International Application No. PCT/KR2022/006761.

(Continued)

*Primary Examiner* — Tracie Y Green
(74) *Attorney, Agent, or Firm* — Sughrue Mion, PLLC

(57) ABSTRACT

A display apparatus includes a display panel; a bottom chassis provided behind the display panel; a reflection sheet provided between the display panel and the bottom chassis; a plurality of light source substrates provided between the reflection sheet and the bottom chassis, each of the plurality of light source substrates having a bar shape extending in a first direction; a plurality of light sources mounted on the plurality of light source substrates and configured emit light toward the display panel; and a bonding member bonding the plurality of light source substrates to the bottom chassis, wherein the bonding member extends in a second direction, which is different from the first direction, so that the plurality of light source substrates are arranged in the second direction on the bottom chassis.

16 Claims, 10 Drawing Sheets

(56) References Cited

U.S. PATENT DOCUMENTS

| | | | | |
|---|---|---|---|---|
| 2009/0135330 A1* | 5/2009 | Kawase | ............ | G02F 1/133603 |
| | | | | 362/97.2 |
| 2009/0135331 A1* | 5/2009 | Kawase | ............ | G02F 1/133605 |
| | | | | 362/97.2 |
| 2015/0293405 A1 | 10/2015 | Park et al. | | |
| 2016/0238895 A1* | 8/2016 | Choi | ................. | G02F 1/133605 |
| 2019/0196082 A1* | 6/2019 | Jeong | ................... | G02B 6/0065 |
| 2019/0285246 A1* | 9/2019 | Yamamoto | ........ | G02F 1/133605 |
| 2020/0018892 A1* | 1/2020 | Cho | ................. | G02F 1/133605 |
| 2020/0110312 A1* | 4/2020 | Park | ................. | G02F 1/133617 |
| 2021/0405456 A1* | 12/2021 | Kim | ..................... | G02B 6/0055 |

FOREIGN PATENT DOCUMENTS

| | | |
|---|---|---|
| KR | 10-0990421 B1 | 10/2010 |
| KR | 10-2016-0099774 A | 8/2016 |
| KR | 10-2131815 B1 | 7/2020 |
| KR | 10-2021-0047204 A | 4/2021 |
| WO | 2014/014134 A1 | 1/2014 |
| WO | WO-2020096236 A1 * | 5/2020 ............ G02B 6/0033 |

OTHER PUBLICATIONS

Written Opinion (PCT/ISA/237) dated Aug. 31, 2022 issued by the International Searching Authority in International Application No. PCT/KR2022/006761.

* cited by examiner

DISPLAY APPARATUS INCLUDING BONDING MEMBER FOR ENHANCED HEAT DISSIPATION

CROSS-REFERENCE TO RELATED APPLICATION

This application is a by-pass continuation of PCT Application No. PCT/KR2022/006761, filed on May 11, 2022, which is based on and claims priority under 35 U.S.C. § 119 to Korean Patent Application No. 10-2021-0107129 filed on Aug. 13, 2021, in the Korean Intellectual Property Office, the disclosure of which is incorporated by reference herein in its entirety.

BACKGROUND

1. Field

The disclosure relates to a display apparatus, and more particularly, to a display apparatus with enhanced heat radiation characteristics.

2. Description of Related Art

In general, display apparatuses are a type of output device for displaying electrically stored information obtained or stored for the user by converting the electrically stored information to visual information, and are used in various fields such as homes or work places.

The display apparatus includes a light source module to convert electrically stored information to visual information, and the light source module includes a plurality of light sources to separately emit light.

Each of the plurality of light sources includes, for example, a light emitting diode (LED) or an organic LED (OLED). For example, the LED or the OLED may be mounted on a circuit board or a substrate.

The plurality of light sources may be mounted on a light source substrate, which may be coupled to a structure such as a bottom chassis. In this case, screws or bonding members may be used to install the light source substrate onto the bottom chassis, in which case a large space or a large number of processes are required for the installation. Furthermore, because the light source substrate and the bottom chassis are not in complete contact with each other, it is difficult to radiate heat generated from the light sources, and the space between the light source substrate and the bottom chassis causes vibration and noise.

SUMMARY

Provided is a display apparatus with enhanced heat radiation characteristics.

Also provided is a display apparatus with minimized non-coplanarity of a light source substrate installed on a bottom chassis.

According to an aspect of the disclosure, a display apparatus includes: a display panel; a bottom chassis provided behind the display panel; a reflection sheet provided between the display panel and the bottom chassis; a plurality of light source substrates provided between the reflection sheet and the bottom chassis, each of the plurality of light source substrates having a bar shape extending in a first direction; a plurality of light sources mounted on the plurality of light source substrates and configured emit light toward the display panel; and a bonding member bonding the plurality of light source substrates to the bottom chassis, wherein the bonding member extends in a second direction, which is different from the first direction, so that the plurality of light source substrates are arranged in the second direction on the bottom chassis.

The reflection sheet may include: a first surface facing the display panel; and a second surface opposite to the first surface and facing the bottom chassis, and the second surface of the reflection sheet is bonded to bottom chassis by an adhesive.

The bottom chassis may include: a base; and a recess that is recessed from the base in a rearward direction.

The base may be bonded to the second surface of the reflection sheet, and the recess extends in the first direction to accommodate at least one of the plurality of light source substrates.

Each of the plurality of light source substrates may include: a first surface bonded to the second surface of the reflection sheet, and a second surface opposite to the first surface of the light source substrate, the second surface of the light source substrate being bonded to a surface of the recess.

Each of the plurality of light source substrates may include a plurality of side surfaces between the first surface of the light source substrate and the second surface of the light source substrate, and the recess may include: a plurality of side portions, each of the plurality of side portions covering side surfaces between the first surface and the second surface of each of the plurality of light source substrates; and a contact surface behind the plurality of side portions to be bonded to the second surface of the light source substrate.

The first direction and the second direction may be perpendicular to each other.

The second direction may be a left and right direction or a vertical direction of the display apparatus.

The bonding member may include: a first bonding portion provided between the base and the reflection sheet to bond the bottom chassis to the reflection sheet; and a second bonding portion provided between the recess and the plurality of light source substrates to bond the bottom chassis to the plurality of light source substrates.

The first bonding portion may be provided between the second surface of the reflection sheet and the base.

Each of the plurality of light source substrates may include: a first surface bonded to the second surface of the reflection sheet; and a second surface opposite to the first surface of the light source substrate, the second surface of the light source substrate being bonded to a surface of the recess, and the second bonding portion is provided between the second surface of each of the plurality of light source substrates and the surface of the recess.

According to an aspect of the disclosure, a display apparatus includes: a plurality of light sources; a display provided in front of the plurality of light sources; an optical sheet provided between the plurality of light sources and the display; a plurality of light source substrates provided behind the optical sheet and on which the plurality of light sources is mounted, each of the plurality of light source substrates having a bar shape extending in a first direction; a bottom chassis provided behind the display and including a base and a plurality of recesses that are recessed rearward from the base, wherein the plurality of light source substrates are accommodated in the plurality of recesses; and a bonding member extending in a second direction and bonding the plurality of light source substrates to the plurality of recesses, wherein the base is provided between adjacent recesses of the plurality of recesses in the second direction.

Each of the plurality of light source substrates may include: a first surface on which the plurality of light sources is mounted; a second surface opposite to the first surface; and third surfaces between the first surface and the second surface.

Each of the plurality of recesses may include: side portions covering the third surfaces of the plurality of light source substrates; and a contact surface provided behind the side portions and bonded to the second surface of each of the plurality of light source substrates.

The display apparatus may further include a reflection sheet between the optical sheet and the bottom chassis, wherein the reflection sheet includes: a first surface facing the optical sheet; and a second surface to which an adhesive is applied to bond the first surface of each of the plurality of light source substrates to the base of the bottom chassis.

The bonding member may include: a first bonding portion provided between the base and the second surface of the reflection sheet to bond the bottom chassis to the second surface of the reflection sheet; and a second bottom portion provided between the recess and the second surface of each of the plurality of light source substrates to bond the bottom chassis to the second surface of each of the plurality of light source substrates.

The first direction and the second direction may be perpendicular to each other.

According to an aspect of the disclosure, a display apparatus includes: a display; a bottom chassis provided behind the display; an optical sheet provided between the display and the bottom chassis; a reflection sheet provided behind the optical sheet and bonded to the bottom chassis; a light source substrate accommodated in the bottom chassis, the light source substrate having a bar shape extending in a first direction; and a bonding member provided on the bottom chassis and extending in a second direction, the bonding member including a first bonding part provided between the reflection sheet and the bottom chassis and a second bonding part provided between the light source substrate and the bottom chassis.

The light source substrate may include: a first surface facing the reflection sheet; and a second surface opposite to the first surface and bonded to the bottom chassis, wherein the reflection sheet includes: a first surface facing the optical sheet; and a second surface opposite to the first surface of the reflection sheet, the second surface of the reflection sheet being bonded to the first surface of the light source substrate and to the bottom chassis.

An adhesive may be applied to the second surface of the reflection sheet, wherein the bottom chassis includes: a base bonded to the second surface of the reflection sheet; and a recess extending in the first direction and recessed in a rearward direction from the base, the light source substrate being accommodated in the base.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF EMBODIMENTS

Figure 1:
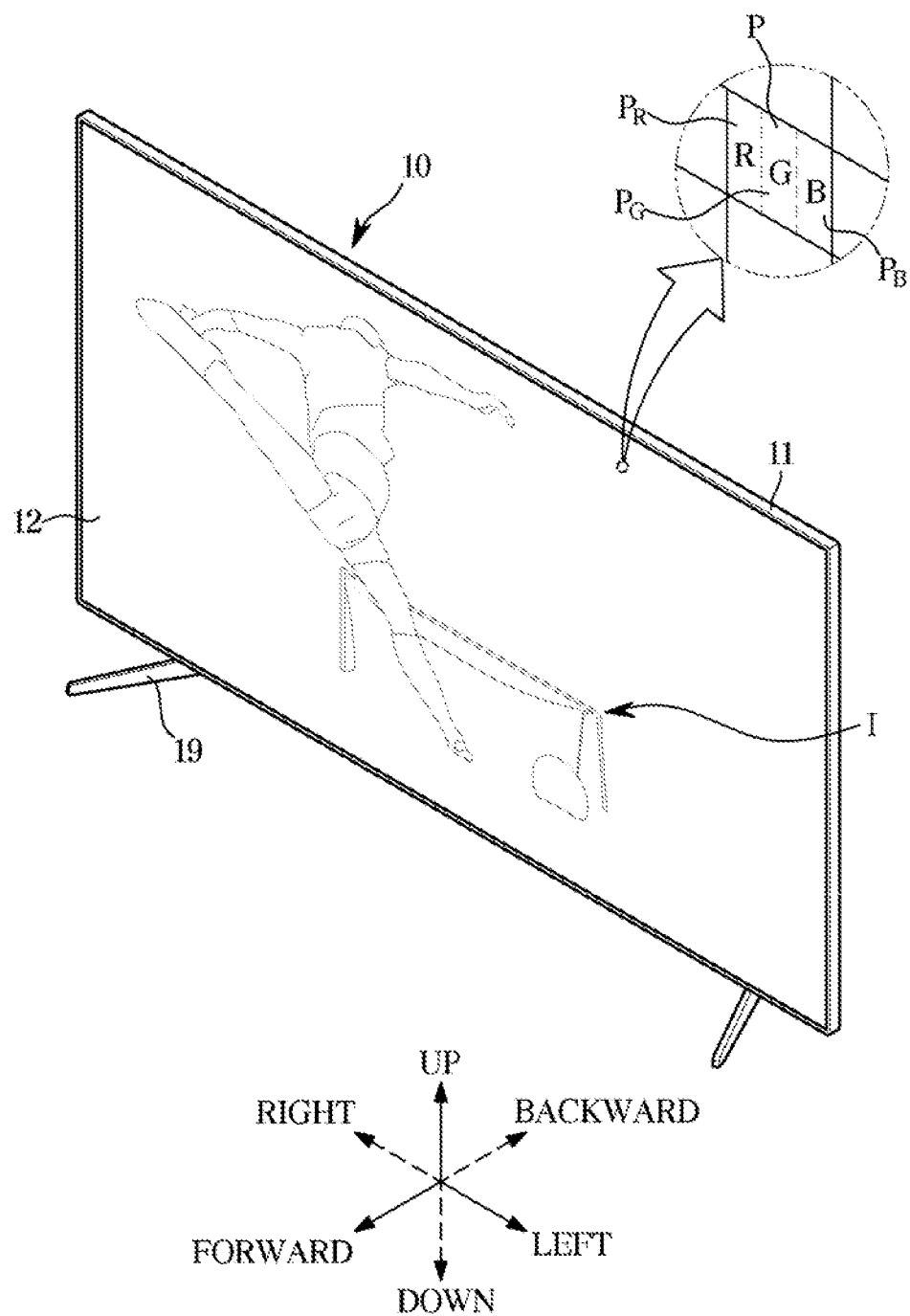
FIG. 1 illustrates an exterior of a display apparatus, according to an embodiment of the disclosure.

Embodiments and features as described and illustrated in the disclosure are merely examples, and there may be various modifications replacing the embodiments and drawings at the time of filing this application.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or room discussed below could be termed a second element, component, region, layer or section without departing from the teachings of the disclosure. Descriptions shall be understood as to include any and all combinations of one or more of the associated listed items when the items are described by using the conjunctive term "~ and/or ~," or the like.

The terms "forward (or front)", "rearward (or behind)", "left", and "right" as herein used are defined with respect to the drawings, but the terms may not restrict the shape and position of the respective components.

Embodiments of the disclosure will now be made in detail with reference to accompanying drawings.

FIG. 1 illustrates an exterior of a display apparatus, according to an embodiment of the disclosure.

Referring to FIG. 1, a display apparatus 10 is a device that is able to process image signals received from an external source and visually present the processed image. In the following description, it is assumed that the display apparatus 10 is a television (TV), but embodiments of the disclosure are not limited thereto. For example, the display apparatus 10 may be implemented in various forms, such as a monitor, a portable multimedia device, a portable communication device, and any device capable of visually presenting images, without being limited thereto.

The display apparatus 10 may be a large format display (LFD) installed outdoors such as on a rooftop of a building or at a bus stop. The display apparatus 10 is not, however, exclusively installed outdoors, but may be installed at any place, even indoors, e.g., at locations with a lot of foot traffic such as subway stations, shopping malls, theaters, offices, stores, etc.

The display apparatus 10 may receive content data including video data and audio data from various content sources, and output video and audio corresponding to the video data and the audio data. For example, the display apparatus 10 may receive content data through a broadcast receiving antenna or a cable, receive content data from a content reproducing device, or receive content data from a content providing server of a content provider.

As shown in FIG. 1, the display apparatus 10 may include a main body 11, a screen 12 for displaying an image I, and a supporter or stand 19 arranged under the main body 11 for supporting the main body 11.

The main body 11 forms the exterior of the display apparatus 10, and components enabling the display apparatus 10 to display the image I or to perform many different functions may be included in the main body 11. Although the main body 11 of FIG. 1 is shaped like a flat plate, it is not limited thereto. For example, the main body 11 may have the form of a curved plate.

The screen 12 may be formed on the front of the main body 11 for displaying the image I. For example, the screen 12 may display still images or moving images. For example, the screen 12 may display two dimensional (2D) plane images, or three dimensional (3D) stereographic images using parallax of both eyes of the user.

The screen 12 may include e.g., a self-luminous panel (e.g., an LED panel or an OLED panel) capable of emitting light, or a non-luminous panel (e.g., a liquid crystal panel) capable of passing or blocking light emitted from a light source device (e.g., a backlight unit).

A plurality of pixels P are formed on the screen 12, and the image I displayed on the screen 12 may be formed by the light emitted by each of the plurality of pixels P. For example, the light emitted by the plurality of pixels P may be combined like mosaics into the image I on the screen 12.

Each of the plurality of pixels P may emit light in various colors and brightnesses. Each of the plurality of pixels P may include subpixels $P_R$, $P_G$, and $P_B$ to emit different colors of light.

The subpixels $P_R$, $P_G$, and $P_B$ may include a red subpixel $P_R$ to emit red light, a green subpixel $P_G$ to emit green light, and blue subpixel $P_B$ to emit blue light. For example, the red light may have wavelengths of about 620 nanometers (nm, a billionth of a meter) to about 750 nm; green light may have wavelengths of about 495 nm to about 570 nm; and blue light may have wavelengths of about 450 nm to about 495 nm.

By combinations of the red light of the red subpixel $P_R$, the green light of the green subpixel $P_G$, and the blue light of the blue subpixel $P_B$, each of the pixels P may emit various brightnesses and colors of light.

Figure 2:
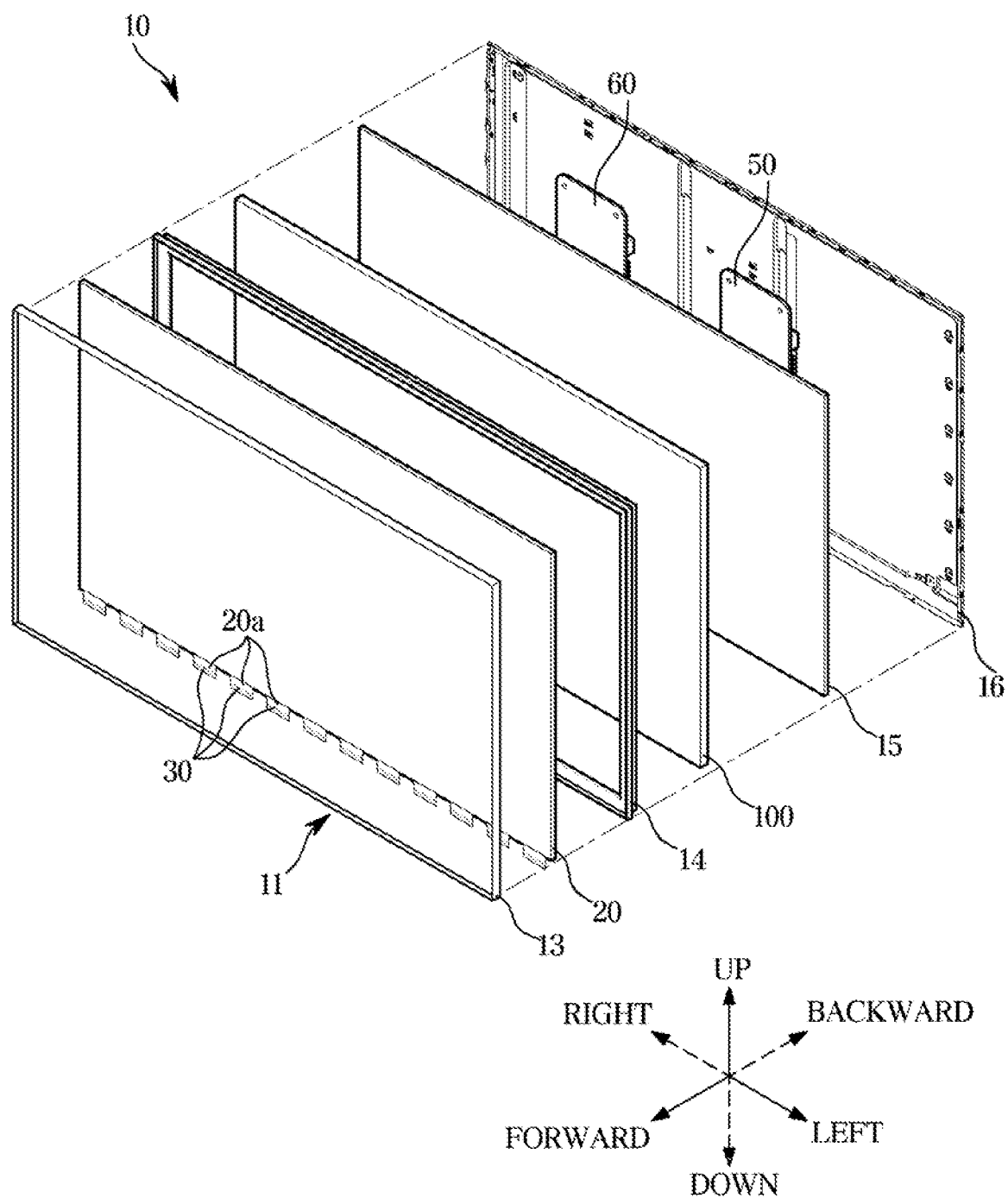
FIG. 2 is an exploded view of the display apparatus shown in FIG. 1, according to an embodiment of the disclosure.

FIG. 2 is an exploded view of the display apparatus 10 shown in FIG. 1, according to an embodiment of the disclosure.

Referring to FIG. 2, many different kinds of components to produce the image I on the screen 12 may be included in the main body 11.

For example, a light source device 100, which is a surface light source, a display panel 20 for blocking or passing the light emitted from the light source device 100, a control assembly 50 for controlling operations of the light source device 100 and the display panel 20, and a power assembly 60 for supplying power to the light source device 100 and the liquid crystal panel 20 are equipped in the main body 11. Furthermore, the main body 11 includes a bezel 13, a frame middle mold 14, a bottom chassis 15, and a rear cover 16 to support and secure the display panel 20, the light source device 100, the control assembly 50, and the power assembly 60. The bottom chassis 15 may cover the back of the light source device 100. Alternatively, the bottom chassis 15 may be integrated in the light source device 100.

The light source device 100 may include point light sources for emitting monochromatic light or white light, and refract, reflect, and scatter the light emitted from the point light sources to convert the light to uniform surface light. For example, the light source device 100 may include a plurality of light sources for emitting monochromatic light or white light, a diffuser plate for diffusing incident light from the plurality of light sources, a reflection sheet for reflecting light emitted from the plurality of light sources and the rear surface of the diffuser plate, and an optical sheet for refracting and scattering light emitted from the front surface of the diffuser plate.

In this way, the light source device 100 may emit uniform surface light in a forward direction by refracting, reflecting and scattering the light emitted from the light sources.

A structure of the light source device 100 will now be described in more detail.

Figure 3:
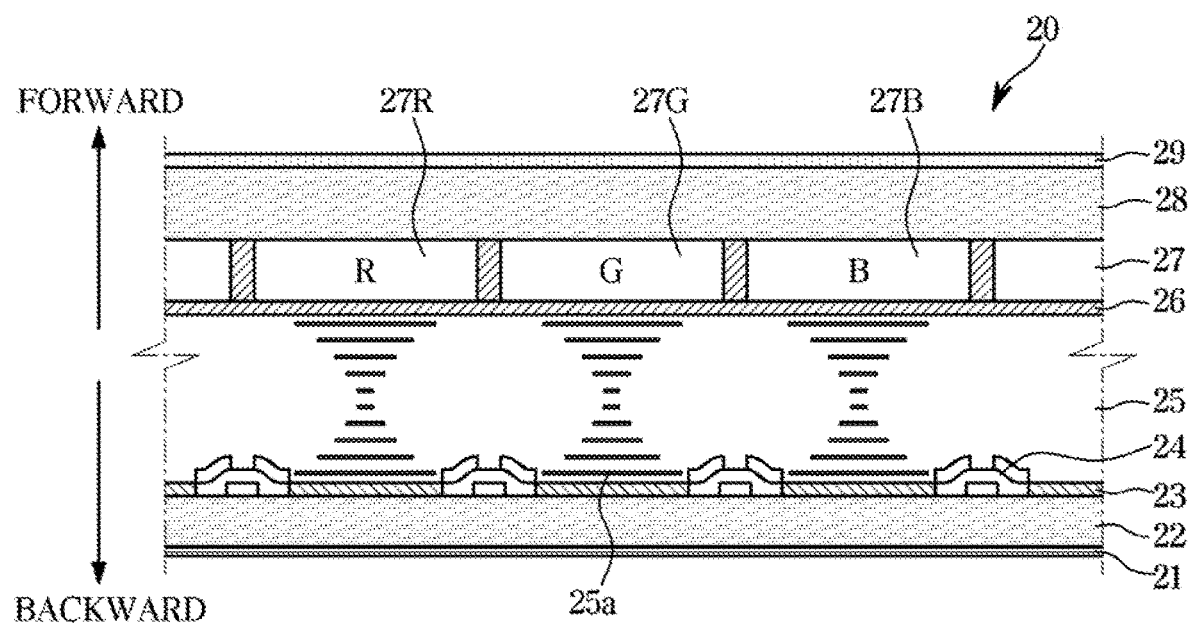
FIG. 3 is a detailed view of a display panel in the display apparatus shown in FIG. 2, according to an embodiment of the disclosure.

FIG. 3 is a detailed view of the display panel 20 in the display apparatus 10 shown in FIG. 2, according to an embodiment of the disclosure.

Referring to FIG. 3, the display panel 20 is arranged in front of the light source device 100 for blocking or passing the light emitted from the light source device 100 to produce the image I.

The front surface of the display panel 20 may form the screen 12 of the aforementioned display apparatus 10, and the display panel 20 may include the plurality of pixels P. Each of the plurality of pixels P included in the display panel 20 may separately block or pass the light from the light source device 100, and the light passed by the plurality of pixels P may form the image I to be displayed on the screen 12.

For example, as shown in FIG. 3, the display panel 20 may include a first polarizer film 21, a first transparent substrate 22, a pixel electrode 23, a thin film transistor (TFT) 24, a liquid crystal layer 25, a common electrode 26, a color filter 27, a second transparent substrate 28, and a second polarizer film 29.

The first transparent substrate 22 and the second transparent substrate 28 may securely support the pixel electrode 23, the TFT 24, the liquid crystal layer 25, the common electrode 26, and the color filter 27. The first and second transparent substrates 22 and 28 may be formed of tempered glass or transparent resin.

On the outer surfaces of the first and second transparent substrates 22 and 28, the first and second polarizer films 21 and 29 are provided, respectively.

The first polarizer film 21 and the second polarizer film 29 are provided on outer sides of the first and second transparent substrates 22 and 28, respectively. The first and second polarizer films 21 and 29 may each pass particularly polarized light while blocking (reflecting or absorbing) differently polarized light. For example, the first polarizer film 21 may pass polarized light of a first direction while blocking (reflecting or absorbing) differently polarized light. Furthermore, the second polarizer film 29 may pass polarized light of a second direction while blocking (reflecting or absorbing) differently polarized light. The first and second directions may be perpendicular to each other. Accordingly, the polarized light that has passed the first polarizer film 21 may not directly pass through the second polarizer film 29.

The color filter 27 may be provided on the inner side of the second transparent substrate 28. The color filter 27 may include, for example, a red color filter 27R for passing red light, a green color filter 27G for passing green light, and a blue color filter 27B for passing blue light. Furthermore, the red, green, and blue color filters 27R, 27G, and 27B may be arranged side by side. An area occupied by the color filter 27 corresponds to the pixel P as described above. An area occupied by the red color filter 27R corresponds to the red subpixel $P_R$; an area occupied by the green color filter 27G corresponds to the green subpixel $P_G$; an area occupied by the blue color filter 27B corresponds to the blue subpixel $P_B$.

The pixel electrode 23 may be arranged on the inner side of the first transparent substrate 22, and the common electrode 26 may be arranged on the inner side of the second transparent substrate 28. The pixel electrode 23 and the common electrode 26 are formed of a conductive metal material, and may produce an electric field to change arrangement of liquid crystal molecules 25a that form the liquid crystal layer 25, which will be described below.

The thin film transistor (TFT) 24 is arranged on the inner side of the second transparent substrate 22. The TFT 24 may be turned on (closed) or turned off (opened) corresponding to image data provided from a panel driver 30. Furthermore, depending on whether the TFT 24 is turned on (closed) or turned off (opened), an electric field may be formed or removed from between the pixel electrode 23 and the common electrode 26.

The liquid crystal layer 25 may be formed between the pixel electrode 23 and the common electrode 26 and filled with liquid crystal molecules 25a. The liquid crystals may be in an intermediate state between solid (crystal) and fluid. The liquid crystals may reveal an optical property according to a change in electric field. For example, the liquid crystal may have varying directions of arrangement of molecules that form the liquid crystal, according to a change in electric field. Consequently, the optical property of the liquid crystal layer 25 may be changed according to whether there is an electric field passing through the liquid crystal layer 25. For example, the liquid crystal layer 25 may rotate polarization direction of light around an optical axis depending on the presence of an electric field. Hence, the polarized light that has passed through the first polarizer film 21 may have a rotating polarization direction while passing the liquid crystal layer 25 and may thus pass through the second polarizer film 29.

Referring to FIG. 2, on one side of the display panel 20, provided are a cable 20a for transmitting image data to the display panel 20 and a display driver integrated circuit (DDI) 30 (hereinafter, called a 'panel driver') for processing digital image data to output an analog image signal.

The cable 20a may electrically connect the control assembly 50/the power assembly 60 to the panel driver 30 and further may connect the panel driver 30 to the display panel 20. The cable 20a may include e.g., a flexible flat cable that is bendable or a film cable.

The panel driver 30 may receive image data and power from the control assembly 50/power assembly 60 through the cable 20a. The panel driver 30 may also provide image data and a driving current to the display panel 20 through the cable 20a.

Furthermore, the cable 20a and the panel driver 30 may be integrally implemented as a film cable, a chip on film (COF), a tape carrier package (TCP), etc. In other words, the panel driver 30 may be arranged on the cable 20a. It is not, however, embodiments are not limited thereto, and the panel driver 30 may be arranged on the display panel 20.

The control assembly 50 may include a control circuit for controlling operations of the display panel 20 and the light source device 100. The control circuit may process image data received from an external content source, transmit image data to the display panel 20, and transmit dimming data to the light source device 100.

The power assembly 60 may include a power circuit for supplying power to the display panel 20 and the light source device 100. The power circuit may supply power to the control assembly 50, the light source device 100, and the display panel 20.

The control assembly 50 and the power assembly 60 may be implemented with printed circuit boards (PCBs) and various circuits mounted on the PCBs. For example, the power circuit may include a power circuit board, and a capacitor, a coil, a resistor, a processor, etc., which are mounted on the power circuit board. Furthermore, the control circuit may include a control circuit board with a memory and a processor mounted thereon.

Figure 4:
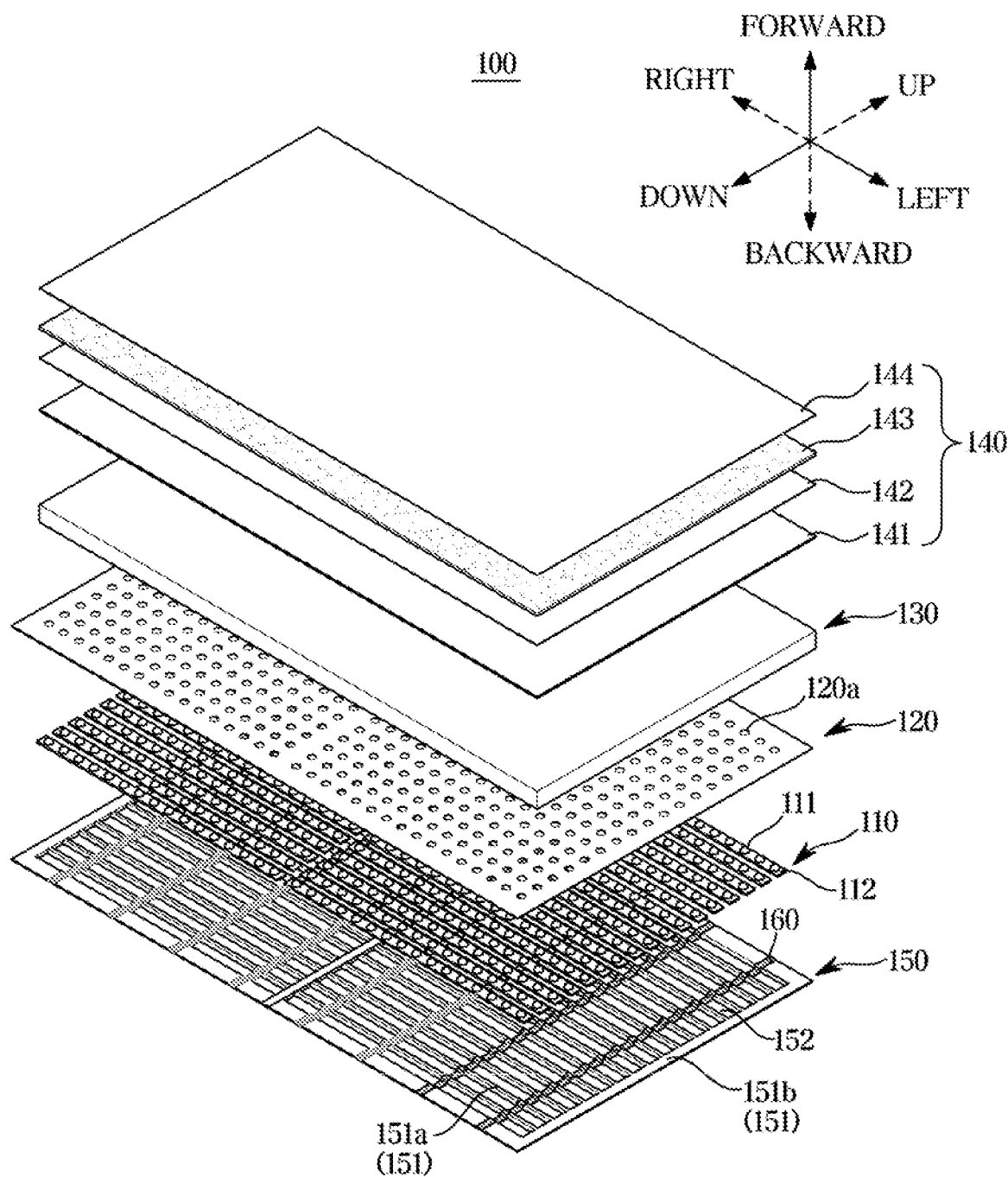
FIG. 4 is an exploded view of a light source device in the display apparatus shown in FIG. 2.
Figure 5:
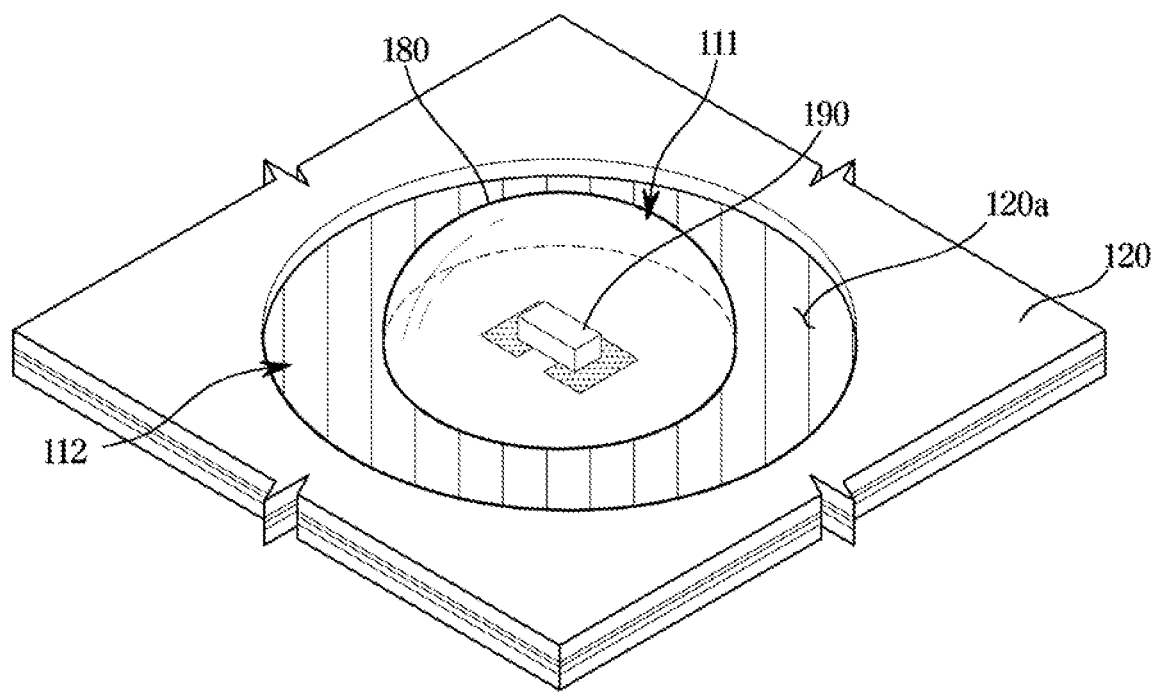
FIG. 5 is an enlarged view of a portion of a light source module in the light source device shown in FIG. 4.

FIG. 4 is an exploded view of the light source device 100 in the display apparatus 10 shown in FIG. 2. FIG. 5 is an enlarged view of a portion of a light source module in the light source device 100 shown in FIG. 4.

Referring to FIGS. 4 and 5, the light source device 100 includes a light source module 110 for generating light, a reflection sheet 120 for reflecting light, a diffuser plate 130 for uniformly diffusing light, an optical sheet 140 for enhancing brightness of output light, and a bottom chassis 150 (corresponding to the bottom chassis 15 of FIG. 2). The bottom chassis 150 may be a component of the light source device 100.

The light source module 110 may include a plurality of light sources 111 for emitting light, and a light source substrate 112 for supporting/fixing the plurality of light sources 111.

The plurality of light sources 111 may be arranged in a predefined pattern to emit light with uniform brightness. The plurality of light sources 111 may be arranged such that each light source is equidistant from its neighboring light sources. Alternatively, the plurality of light sources 111 may be arranged such that one or more light sources is not equidistant from its neighboring light sources.

The light source 111 may employ a device capable of emitting monochromatic light (light having a wavelength in a particular range or light having a peak wavelength, e.g., blue light) or white light (light having a plurality of peak wavelengths, e.g., a mixture of red light, green light, and blue light) to various directions when powered.

Referring to FIG. 5, each of the plurality of light sources 111 may include an LED 190 and an optical dome 180.

The thinner the display apparatus 10, the thinner the light source device 100 is required to be. To make the light source device 100 thinner, each of the plurality of light sources 111 must be made thinner and the structure becomes simpler.

The LED 190 may be attached directly to the light source substrate 112 in a method of chip on board (COB). For example, the light source 111 may include the LED 190 with an LED chip or an LED die attached directly to the light source substrate 112 without extra packaging.

The LED 190 may be manufactured in a flip chip type. The LED 190 of the flip chip type may not use an intermediate medium such as a metal lead (wire) or a ball grid array (BGA) to attach the LED, which is a semiconductor device, to the light source substrate 112, but may fuse an electrode pattern of the semiconductor device onto the light source substrate 112 as it is. This may make it possible for the light source 111 including the LED 190 of the flip chip type to become smaller by omitting the metal lead (wire) or the ball grid array.

Although the LED 190 is described above as having a flip chip type directly fused onto the light source substrate 112 in the COB method, the light source 111 is not limited to the flip chip type LED. For example, the light source 111 may include a package type of LED.

The optical dome 180 may cover the LED 190. The optical dome 180 may prevent or reduce damage to the LED 190 due to an external mechanical action and/or chemical action.

The optical dome 180 may be shaped like, for example, a dome obtained by cutting a sphere without including the center or a semi-sphere obtained by cutting the sphere with the center included. A vertical cross-section of the optical dome 180 may have, e.g., an arcuate form or a semi-circular form.

The optical dome 180 may be formed of silicon or epoxy resin. For example, melted silicon or epoxy resin is discharged onto the LED 190 through e.g., a nozzle, and then hardened to form the optical dome 180.

The optical dome 180 may have a diameter of about 10 mm or less and a height of about 5 mm or less. Preferably, the optical dome 180 may have a diameter of about 3 mm or less and a height of about 1 mm or less.

The optical dome 180 may be optically transparent or translucent. Light emitted from the LED 190 may pass through the optical dome 180 to the outside.

In this case, the optical dome 180 may refract the light like a lens. For example, the light emitted from the LED 190 may be refracted and dispersed by the optical dome 180.

As such, the optical dome 180 may not only protect the LED 190 from an external mechanical action and/or chemical action or electrical action, but also scatter the light emitted from the LED 190.

Although the optical dome 180 is described as being dome-shaped, the light source 111 is not limited to including the optical dome 180. For example, the light sources 111 may include a lens for diffusing the light emitted from the LED.

The light source substrate 112 may fix the plurality of light sources 111 to prevent the light sources 111 from being moved. In addition, the light source substrate 112 may supply power to each of the light sources 111 so that the light source 111 may emit light.

The light source substrate 112 may fix the plurality of light sources 111, and may be formed of a synthetic resin, tapered glass or a PCB with conductive power supply lines formed therein to supply power to the light sources 111.

The light source substrate 112 may extend in a first direction. A light source may be mounted on the light source substrate 112 extending in the first direction. For example, the light source substrate 112 may extend in a left-right direction to have the light source mounted thereon. It is not, however, limited thereto, and the light source substrate 112 may extend in a left-right direction or a front-back direction. In other words, the first direction may be the left-right direction, vertical direction, and/or front-back direction.

The light source substrate 112 may have a bar shape. The light source substrate 112 is not, however, limited thereto, and the light source substrate 112 may have various shapes.

The light source substrate 112 may be provided in plural. A plurality of light source substrates 112 may be arranged in a second direction. The second direction may be different from the first direction. For example, the second direction may cross and/or lie at right angles to the first direction. The second direction may be a vertical direction. The second direction is not, however, limited thereto, and the second direction may be a vertical direction, left-right direction and/or front-back direction.

The reflection sheet 120 may reflect light emitted from the plurality of light sources 111 to a forward direction or to a nearly forward direction.

A plurality of through holes 120a (e.g., a plurality of holes) are formed on the reflection sheet 120 at positions respectively matching the plurality of light sources 111 of the light source module 110. The plurality of through holes 120a may be equidistantly arranged. It is not, however, limited thereto, and the plurality of through holes 120a may be arranged such that at least one of the through holes 120a is not equidistant to its neighboring through holes 120a. Furthermore, the light sources 111 of the light source module 110 may pass the through holes 120a and protrude forward from the reflection sheet 120. Accordingly, the plurality of light sources 111 may emit light from the front of the reflection sheet 120. The reflection sheet 120 may reflect the light emitted from the plurality of light sources 111 toward the reflection sheet 120 toward the diffuser plate 130.

The diffuser plate 130 may be arranged in front of the light source module 110 and the reflection sheet 120 to uniformly diffuse the light emitted from the light sources 111 of the light source module 110.

As described above, the plurality of light sources 111 are located everywhere on the rear surface of the light source device 100. The plurality of light sources 111 may be equidistantly arranged on the rear surface of the light source device 100, but there may be differences in brightness depending on the positions of the plurality of light sources 111.

To avoid the non-uniformity in brightness due to the plurality of light sources 111, the diffuser plate 130 may diffuse the light emitted from the plurality of light sources 111 within the diffuser plate 130. In other words, the diffuser plate 130 may emit incident non-uniform light as uniform light forward from the plurality of light sources 111.

The optical sheet 140 may include various sheets to improve brightness and uniformity in brightness. For example, the optical sheet 140 may include a light conversion sheet 141, a diffuser sheet 142, a prism sheet 143, and a reflective polarizer sheet 144, etc.

The optical sheet 140 is not limited to the sheets or films as illustrated in FIG. 4, and may further include other various sheets or films such as protective sheets.

The bottom chassis 150 may be a component included in the light source device 100.

The bottom chassis 150 may be arranged behind the display panel 20. The bottom chassis 150 may protect various components included in the display panel 20 against external shocks. The light source module 110 may be installed on the bottom chassis 150. The bottom chassis 150 may be shaped substantially like a rectangle. The shape of the bottom chassis 150 is not, however, limited to the rectangle.

The bottom chassis 150 may include a base 151 for supporting the display panel 20, the diffuser plate 130, the optical sheet 140 and/or the reflection sheet 120, and a recess 152 (e.g., an elongated recess) sunken from the base 151 in which the light source substrate 112 may be installed. The base 151 may include a first base 151a and a second base 151b.

The light source device 100 may further include a bonding member 160 (e.g., a bonding strip). The bonding member 160 may bond the bottom chassis 150 to the light source substrate 112. The bonding member 160 may extend in the second direction different from the first direction. The bonding member 160 may be applied onto the bottom chassis 150. After the bonding member 160 is applied onto the bottom chassis 150 in the second direction, the light source substrate 112 extending in the first direction may be bonded to the bottom chassis 150. In this way, the plurality of light source substrates 112 may be arranged in the second direction. A different bonding member 160 is not used for every light source substrate 112. Instead, the bonding member 160 is applied onto the bottom chassis 150 a small number of times, thereby reducing the number of processing times.

Figure 6:
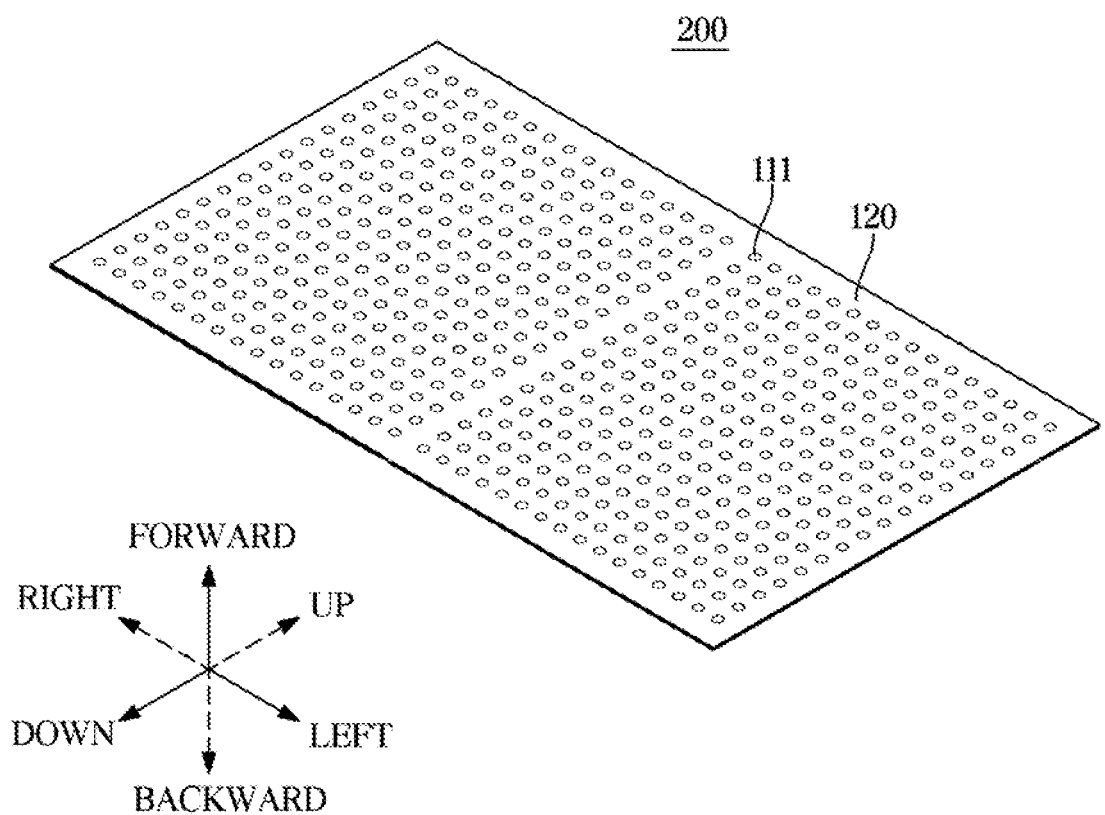
FIG. 6 is a perspective view of a light source assembly included in the light source device shown in FIG. 4.
Figure 7:
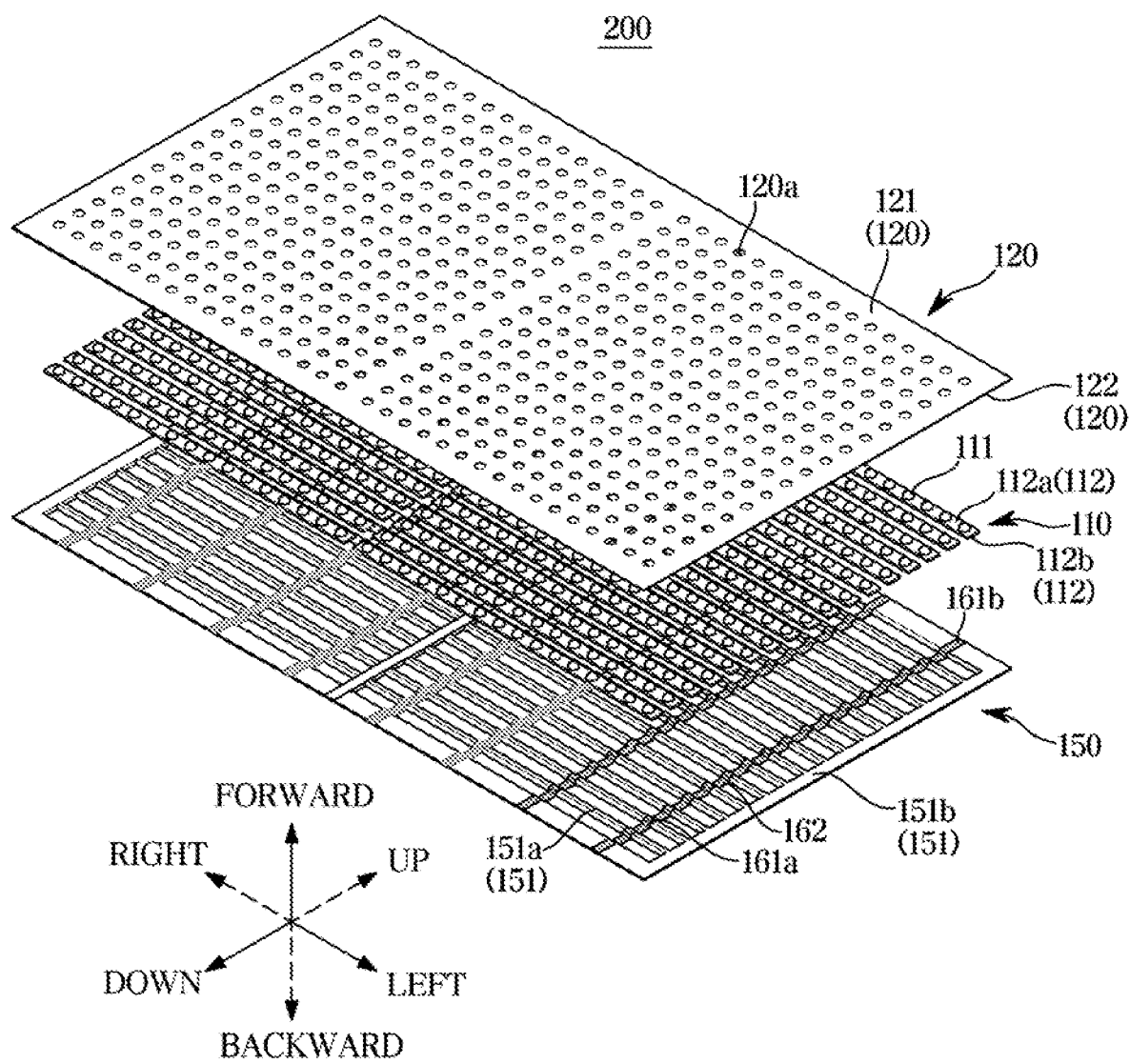
FIG. 7 is an exploded view of the light source assembly shown in FIG. 6.

Referring to FIGS. 6 and 7, a display apparatus may include the light source device 100 according to an embodiment of the disclosure. The light source device 100 may include a light source assembly 200. The light source assembly 200 may include the reflection sheet 120, the light source substrate 112 on which the light sources 111 are mounted, and the bottom chassis 150 for supporting the reflection sheet 120 and the light source substrate 112. In an embodiment of the disclosure, the reflection sheet 120 may be omitted from the light source assembly 200.

The reflection sheet 120 may have a first surface 121 facing the display panel 20, and a second surface 122 arranged on an opposite side of the first surface 121.

The light sources 111 may be mounted on the light source substrate 112. The light source substrate 112 may face the reflection sheet 120, and may have a first surface 112a on which the light sources 111 are mounted and a second surface 112b arranged on an opposite side of the first surface 112a.

The bottom chassis 150 may include the base 151 and the recess 152.

The base 151 may include the first base 151a and the second base 151b. The first base 151a may be arranged between adjacent recesses of a plurality of recesses 152. For example, the first base 151a may be located between recesses 152 in the second direction. The first base 151a may extend in the first direction. The second base 151b may form edges of the bottom chassis 150. Alternatively, the second base 151b may be arranged on edges of the bottom chassis 150.

The recess 152 may be sunken from the base 151. The recess 152 may be sunken from the base 151 in one direction. Specifically, the recess 152 may be sunken from the base 151 in a third direction different from the first direction and the second direction. For example, the recess 152 may be sunken rearward from the base 151 (e.g., in a rearward direction).

The light source substrate 112 may be settled in the recess 152. The recess 152 may extend in the first direction to receive the light source substrate 112 stably. For example, the recess 152 may be provided in the plural. The plurality of light source substrates 112 may be settled in the plurality of recesses 152, respectively. However, embodiments are not limited thereto, and two or more light source substrates 112 may be mounted in one of the plurality of recesses 152.

The light source device 100 may further include a bonding member 160. The bonding member 160 may bond the bottom chassis 150 to the light source substrate 112. For example, the light source substrate 112 may be bonded by the bonding member 160 to the bottom chassis 150 and received in the recess 152. That is, the light source substrate 112 may be bonded to the recess 152. The bonding member 160 may be arranged between the recess 152 and the light source substrate 112. Furthermore, the bonding member 160 may bond the bottom chassis 150 to the reflection sheet 120. For example, the bonding member 160 may bond the base 151 of the bottom chassis 150 to the second surface 122 of the reflection sheet 120.

The bonding member 160 may include a first bonding portion 161 (e.g., a first bonding part) and a second bonding portion 162 (e.g., a second bonding part).

The first bonding portion 161 may bond the bottom chassis 150 to the reflection sheet 120. The first bonding portion 161 may be arranged between the base 151 and the second surface 122 of the reflection sheet 120. For example, the first bonding portion 161 may be arranged on the base 151 to closely bond the reflection sheet 120 to the bottom chassis 150.

The second bonding portion 162 may bond the bottom chassis 150 to the light source substrate 112. The second bonding portion 162 may bond a surface of the recess 152 to the light source substrate 112. For example, the second bonding portion 162 may be arranged on a contact surface 152b of the recess 152 to bond the contact surface 152b of the recess 152 to the second surface 112b of the light source substrate 112.

Figure 8:
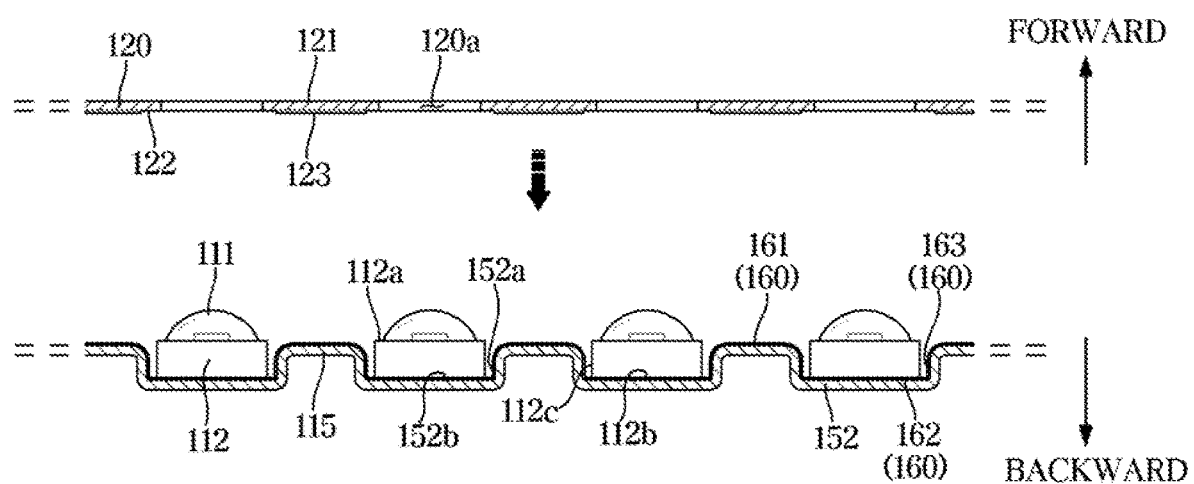
FIG. 8 is a schematic view illustrating a bonding process between a reflection sheet and the light source module in the light source assembly shown in FIG. 6.
Figure 9:
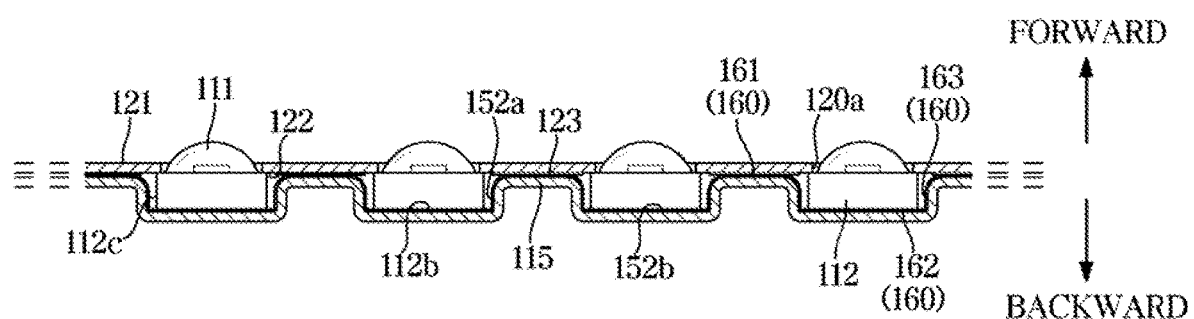
FIG. 9 is a schematic view illustrating the reflection sheet and the light source module bonded in the light source assembly shown in FIG. 8.
Figure 10:
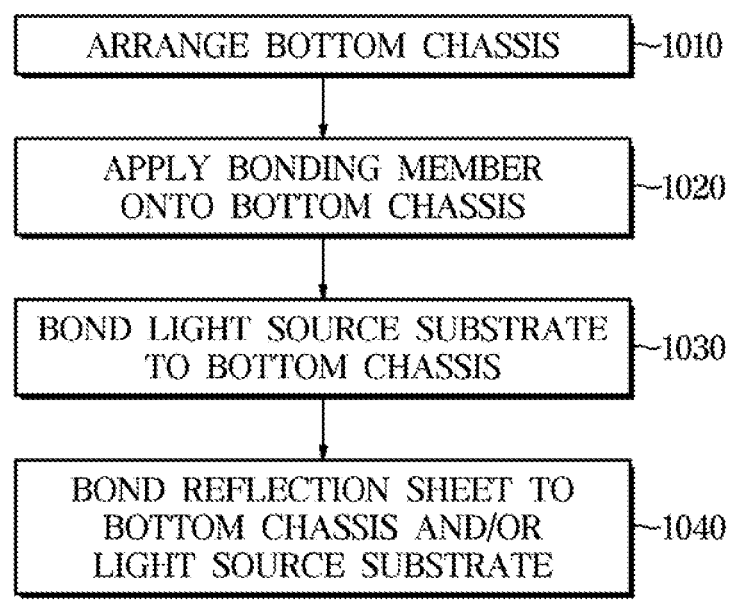
FIG. 10 is a flowchart illustrating a method of manufacturing the light source assembly shown in FIG. 6, according to an embodiment of the disclosure.

FIG. 8 is a schematic view illustrating a bonding process between the reflection sheet 120 and the light source module 110 in the light source assembly 200 shown in FIG. 6, according to an embodiment of the disclosure. FIG. 9 is a schematic view illustrating the reflection sheet 120 and the light source module 110 bonded in the light source assembly 200 shown in FIG. 8. FIG. 10 is a flowchart illustrating a method of manufacturing the light source assembly 200 shown in FIG. 6, according to an embodiment of the disclosure.

Referring to FIGS. 8, 9, and 10, the light source assembly 200 may include the reflection sheet 120, the light source substrate 112, and the bottom chassis 150.

The reflection sheet 120 may further include an adhesive 123 applied to at least a portion of the second surface 122. The adhesive 123 may correspond to a bonding member. Although the adhesive 123 is shown as being applied to a portion of the second surface 122, the disclosure is not limited thereto and it is also possible that the adhesive 123 is applied to the entire second surface 122. Alternatively, the adhesive 123 may be omitted.

The light source substrate 112 may further have third surfaces 112c (e.g., side surfaces) arranged between the first surface 112a and the second surface 112b to define sides of the light source substrate 112.

The recess 152 may include side portions 152a and the contact surface 152b. The side portions 152a may face the third surfaces 112c of the light source substrate 112. The side portions 152a may cover the third surfaces 112c of the light source substrate 112. The contact surface 152b may be a surface on which the light source substrate 112 is settled onto the bottom chassis 150. The contact surface 152b may be bonded by the bonding member 160 to the second surface 112b of the light source substrate 112.

The bonding member 160 may include a third bonding portion. The third bonding portion 163 may be arranged on the side portions 152a of the recess 152. Alternatively, the third bonding portion 163 may be omitted.

A method of manufacturing the light source assembly 200 through coupling of the reflection sheet 120, the light source substrate 112 and the bottom chassis 150 will now be described with reference to FIG. 10.

First, the bottom chassis 150 may be arranged in (1010).

The bonding member 160 may be applied onto the bottom chassis 150 (1020). The bonding member 160 may be applied onto the bottom chassis 150 in the second direction. The bonding member 160 may be applied on a surface of the bottom chassis 150 facing forward when the display apparatus 10 is installed. The first bonding portion 161 of the bonding member 160 may be arranged on the base 151 of the bottom chassis 150, and the second bonding portion 162 of the bonding member 160 may be arranged on the contact surface 152b of the recess 152 of the bottom chassis 150. The third bonding portion 163 may be arranged on the side portions 152a of the recess 152, but it is also possible to omit the third bonding portion 163.

The light source substrate 112 may be bonded to the bottom chassis 150 (1030). The light source substrate 112 may be bonded by the bonding member 160 to the bottom chassis 150. For example, the second surface 112b of the light source substrate 112 may be bonded to the contact surface 152b via the second bonding portion 162. The light source substrate 112 may be settled in the recess 152. The light source substrate 112 may be received in the recess 152. The light source substrate 112 may be provided in the plural. The plurality of light source substrates 112 may extend in the first direction and may be arranged in the second direction along the direction of extension of the bonding member 160.

The reflection sheet 120 may be bonded to the bottom chassis 150 and/or the light source substrate 112 (1040). For example, the reflection sheet 120 arranged in front of the bottom chassis 150 and the light source substrate 112 may be moved backward toward the bottom chassis 150 and the light source substrate 112. The second surface 122 of the reflection sheet 120 may be bonded to the base 151 of the bottom chassis 150 and the first surface 112a of the light source substrate 112. The light source substrate 112 may be received between the reflection sheet 120 and the bottom chassis 150. Unlike what is shown in the drawings, the adhesive 123 may be applied onto the entire second surface 122 except for the through holes 120a, so areas of the first surface 112a of the light source substrate 112 except where the light sources 111 are mounted may be bonded to the second surface 122 of the reflection sheet 120. Accordingly, the reflection sheet 120, the light source substrate 112 and the bottom chassis 150 may be closely bonded to minimize non-coplanarity. As the reflection sheet 120, the light source substrate 112 and the bottom chassis 150 are closely bonded, heat radiation characteristics of the display apparatus 10 may be enhanced with smooth heat transfer, and noise and vibration due to non-planarity may be minimized.

According to embodiments of the disclosure, a display apparatus may have enhanced heat radiation characteristics by closely bonding the reflection sheet, the light source substrate and the bottom chassis.

According to embodiments of the disclosure, a display apparatus may have reduced vibration by closely bonding the reflection sheet, the light source substrate and the bottom chassis.

Embodiments of the disclosure have been described above, but a person of ordinary skill in the art will understand and appreciate that various modifications can be made without departing from the scope of the disclosure. Thus, it will be apparent to those or ordinary skill in the art that the true scope of technical protection is only defined by the following claims.

What is claimed is:

1. A display apparatus comprising:
   a display panel;
   a bottom chassis provided behind the display panel and including a base and a recess that is recessed from the base in a rearward direction;
   a reflection sheet provided between the display panel and the bottom chassis and including a first surface facing the display panel and a second surface opposite to the first surface and facing the bottom chassis, wherein the second surface of the reflection sheet is bonded to the bottom chassis by an adhesive;
   a plurality of light source substrates provided between the reflection sheet and the bottom chassis, each of the plurality of light source substrates having a bar shape extending in a first direction;
   a plurality of light sources mounted on the plurality of light source substrates and configured emit light toward the display panel; and
   a bonding member contacting the plurality of light source substrates and bonding the plurality of light source substrates to the bottom chassis, wherein the bonding member extends in a second direction, which is different from the first direction, so that the plurality of light source substrates are arranged in the second direction on the bottom chassis,
   wherein the base is bonded to the second surface of the reflection sheet, and the recess extends in the first direction to accommodate at least one of the plurality of light source substrates, and
   wherein each of the plurality of light source substrates comprises:
   a first surface bonded to the second surface of the reflection sheet, and
   a second surface opposite to the first surface of the light source substrate, the second surface of the light source substrate being bonded to a surface of the recess.

2. The display apparatus of claim 1, wherein each of the plurality of light source substrates comprises a plurality of side surfaces between the first surface of the light source substrate and the second surface of the light source substrate, and
   wherein the recess comprises:
   a plurality of side portions, each of the plurality of side portions covering side surfaces between the first surface and the second surface of each of the plurality of light source substrates; and
   a contact surface behind the plurality of side portions to be bonded to the second surface of the light source substrate.

3. The display apparatus of claim 2, wherein the first direction and the second direction are perpendicular to each other.

4. The display apparatus of claim 3, wherein the second direction is a left and right direction or a vertical direction of the display apparatus.

5. The display apparatus of claim 1, wherein the bonding member comprises:
   a first bonding portion provided between the base and the reflection sheet to bond the bottom chassis to the reflection sheet; and a second bonding portion provided between the recess and the plurality of light source substrates to bond the bottom chassis to the plurality of light source substrates.

6. The display apparatus of claim 5, wherein the first bonding portion is provided between the second surface of the reflection sheet and the base.

7. The display apparatus of claim 6, wherein each of the plurality of light source substrates comprises:
   a first surface bonded to the second surface of the reflection sheet; and
   a second surface opposite to the first surface of the light source substrate, the second surface of the light source substrate being bonded to a surface of the recess, and
   wherein the second bonding portion is provided between the second surface of each of the plurality of light source substrates and the surface of the recess.

8. A display apparatus comprising:
   a plurality of light sources;
   a display provided in front of the plurality of light sources;
   an optical sheet provided between the plurality of light sources and the display;
   a plurality of light source substrates provided behind the optical sheet and on which the plurality of light sources is mounted, each of the plurality of light source substrates having a bar shape extending in a first direction;
   a bottom chassis provided behind the display and comprising a base and a plurality of recesses that are recessed rearward from the base, wherein the plurality of light source substrates are accommodated in the plurality of recesses; and
   a bonding member extending in a second direction and bonding the plurality of light source substrates to the plurality of recesses,
   wherein the base is provided between adjacent recesses of the plurality of recesses in the second direction.

9. The display apparatus of claim 8, wherein each of the plurality of light source substrates comprises:
   a first surface on which the plurality of light sources is mounted;
   a second surface opposite to the first surface; and
   third surfaces between the first surface and the second surface.

10. The display apparatus of claim 9, wherein each of the plurality of recesses comprises:
    side portions covering the third surfaces of the plurality of light source substrates; and
    a contact surface provided behind the side portions and bonded to the second surface of each of the plurality of light source substrates.

11. The display apparatus of claim 9, further comprising a reflection sheet between the optical sheet and the bottom chassis,
    wherein the reflection sheet comprises:
    a first surface facing the optical sheet; and
    a second surface to which an adhesive is applied to bond the first surface of each of the plurality of light source substrates to the base of the bottom chassis.

12. The display apparatus of claim 11, wherein the bonding member comprises:
    a first bonding portion provided between the base and the second surface of the reflection sheet to bond the bottom chassis to the second surface of the reflection sheet; and
    a second bottom portion provided between the recess and the second surface of each of the plurality of light source substrates to bond the bottom chassis to the second surface of each of the plurality of light source substrates.

13. The display apparatus of claim 12, wherein the first direction and the second direction are perpendicular to each other.

14. A display apparatus comprising:
    a display;
    a bottom chassis provided behind the display;
    an optical sheet provided between the display and the bottom chassis and including a base and a recess that is recessed from the base in a rearward direction;
    a reflection sheet provided behind the optical sheet and bonded to the bottom chassis;
    a light source substrate accommodated in the bottom chassis, the light source substrate having a bar shape extending in a first direction; and
    a bonding member provided on the bottom chassis and extending in a second direction, the bonding member comprising a first bonding part provided between the reflection sheet and the base and a second bonding part contacting the light source substrate and provided between the light source substrate and the recess.

15. The display apparatus of claim 14, wherein the light source substrate comprises:
    a first surface facing the reflection sheet; and
    a second surface opposite to the first surface and bonded to the bottom chassis, and
    wherein the reflection sheet comprises:
    a first surface facing the optical sheet; and
    a second surface opposite to the first surface of the reflection sheet, the second surface of the reflection sheet being bonded to the first surface of the light source substrate and to the bottom chassis.

16. The display apparatus of claim 15, wherein an adhesive is applied to the second surface of the reflection sheet,
    wherein the base is bonded to the second surface of the reflection sheet, and
    wherein the recess extends in the first direction and the light source substrate is accommodated in the base.

* * * * *